United States Patent
Jung et al.

(10) Patent No.: US 8,841,840 B2
(45) Date of Patent: Sep. 23, 2014

(54) ORGANIC LIGHT EMITTING DIODE DISPLAY WITH CONTAMINATION PREVENTING LAYER

(75) Inventors: Woo-Suk Jung, Yongin (KR); Soon-Ryong Park, Yongin (KR); Hye-Jung Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 32 days.

(21) Appl. No.: 13/298,697

(22) Filed: Nov. 17, 2011

(65) Prior Publication Data
US 2012/0242222 A1   Sep. 27, 2012

(30) Foreign Application Priority Data
Mar. 24, 2011 (KR) .................. 10-2011-0026576

(51) Int. Cl.
*H01L 51/52* (2006.01)
(52) U.S. Cl.
CPC .................. *H01L 51/5253* (2013.01)
USPC .......................................................... 313/512
(58) Field of Classification Search
CPC . H01L 51/5253; H01L 51/5256; H05B 33/04
USPC ........................................................ 313/512
See application file for complete search history.

(56) References Cited

U.S. PATENT DOCUMENTS

| | | | | | |
|---|---|---|---|---|---|
| 4,416,791 | A | * | 11/1983 | Haq | 510/296 |
| 5,876,863 | A | * | 3/1999 | Feldman et al. | 428/690 |
| 5,952,778 | A | * | 9/1999 | Haskal et al. | 313/504 |
| 2004/0056589 | A1 | * | 3/2004 | Yamazaki et al. | 313/506 |
| 2004/0188688 | A1 | * | 9/2004 | Muranaka | 257/72 |
| 2006/0147614 | A1 | * | 7/2006 | Mizuno | 427/66 |
| 2007/0273271 | A1 | * | 11/2007 | Yamazaki et al. | 313/504 |
| 2008/0106200 | A1 | * | 5/2008 | Hori et al. | 313/582 |

FOREIGN PATENT DOCUMENTS

| | | | |
|---|---|---|---|
| JP | 2007-134153 A | 5/2007 |
| JP | 2007-194061 A | 8/2007 |
| JP | 2007-200692 A | 8/2007 |
| KR | 10-2008-0004385 A | 1/2008 |
| KR | 10-2009-0100987 A | 9/2009 |

* cited by examiner

*Primary Examiner* — Nimeshkumar Patel
*Assistant Examiner* — Steven Horikoshi
(74) *Attorney, Agent, or Firm* — Lee & Morse, P.C.

(57) ABSTRACT

An OLED display may include: a substrate; an organic light emitting diode on the substrate; a thin film encapsulation layer encapsulates the organic light emitting diode with the substrate; an optical film on the thin film encapsulation layer and including an adhesive layer opposite to the thin film encapsulation layer; and a contamination preventing layer between the thin film encapsulation layer and the optical film, the contamination preventing layer contacting the adhesive layer.

7 Claims, 4 Drawing Sheets

ORGANIC LIGHT EMITTING DIODE DISPLAY WITH CONTAMINATION PREVENTING LAYER

RELATED APPLICATIONS

This application claims priority to and the benefit of Korean Patent Application No. 10-2011-0026576 filed in the Korean Intellectual Property Office on Mar. 24, 2011, the entire contents of which are incorporated herein by reference.

BACKGROUND

1. Field

Embodiments relate generally to an organic light emitting diode (OLED) display. More particularly, embodiments relate to an OLED display using a thin film encapsulation layer as an encapsulation member.

2. Description of the Related Art

An organic light emitting diode display, which is a device displaying an image, has recently attracted attention.

The organic light emitting diode display has a self-emitting characteristic and does not need a separate light source. Thus, the thickness and weight of an organic light emitting diode display are lower than a liquid crystal display. In addition, the organic light emitting diode display has high-grade characteristics, i.e., low power consumption, high luminance, high reaction speed, etc.

In general, the organic light emitting diode display includes a substrate, an organic light emitting diode disposed on the substrate and displaying an image, and an encapsulation member arranged opposite to the substrate, interposing the organic light emitting diode therebetween, and encapsulating the organic light emitting diode.

The above information in the Background is only for enhancing an understanding of the described technology. Therefore, it may contain information that does not form the prior art known to a person of ordinary skill in the art in this country.

SUMMARY

Embodiments are directed to an organic light emitting diode (OLED) display.

An embodiment may be directed to an OLED display including: a substrate; an organic light emitting diode on the substrate; a thin film encapsulation layer encapsulating the organic light emitting diode with the substrate; an optical film on the thin film encapsulation layer and including an adhesive layer arranged opposite to the thin film encapsulation layer; and a contamination preventing layer between the thin film encapsulation layer and the optical film, the contamination preventing layer contacting the adhesive layer.

A surface of the contamination preventing layer contacting the adhesive layer may be more hydrophobic than the thin film encapsulation layer.

The surface of the contamination preventing layer may have a contact angle of about 100 to 200 degrees with respect to water.

The contamination preventing layer may include fluorine (F).

The contamination preventing layer may have weaker adherence compared to the adhesive layer.

The optical film may include a polarization film.

The thin film encapsulation layer may include an inorganic layer contacting the contamination preventing layer.

DETAILED DESCRIPTION

Figure 1:
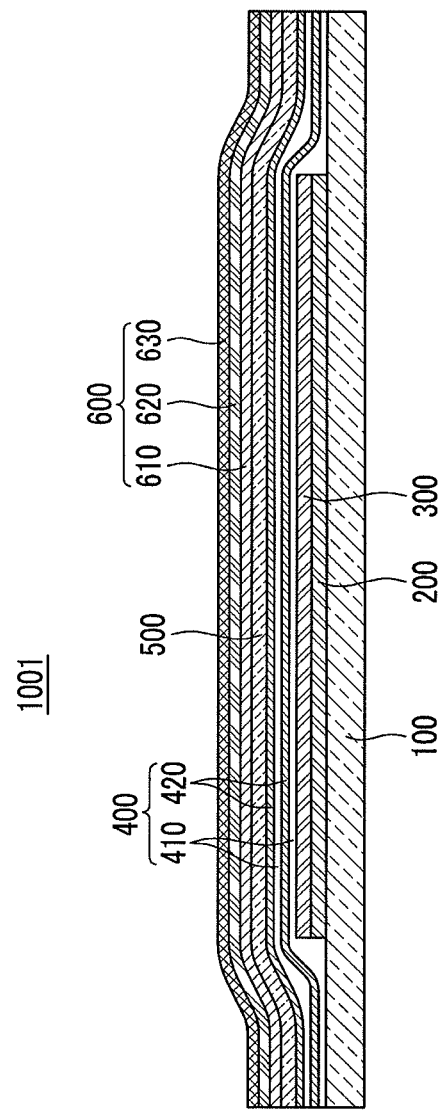
FIG. 1 shows an organic light emitting diode display according to a first exemplary embodiment.

Example embodiments will now be described more fully hereinafter with reference to the accompanying drawings; however, they may be embodied in different forms and should not be construed as limited to the embodiments set forth herein.

In order to elucidate present embodiments, parts that are not related to the description will be omitted. Like reference numerals designate like elements throughout the specification.

In addition, the size and thickness of each component shown in the drawings are arbitrarily shown for understanding and ease of description, but present embodiments are not limited thereto.

In the drawings, the thickness of layers, films, panels, regions, etc., are exaggerated for clarity. In addition, in the drawings, for understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element and does not imply being necessarily positioned on the top on the basis of a gravity direction.

Hereinafter, an organic light emitting diode (OLED) display according to a first exemplary embodiment will be described with reference to FIG. 1 to FIG. 3.

FIG. 1 shows an OLED display according to the first exemplary embodiment.

As shown in FIG. 1, an OLED display 1001 according to the first exemplary embodiment includes a substrate 100, a wiring portion 200, an organic light emitting diode 300, a thin film encapsulation layer 400, a contamination preventing layer 500, and an optical film 600.

The substrate 100 is formed with a material that may be light-transmissive, light-absorptive, or light-transflective. For example, the material may be glass, resin, or metal. The wiring portion 200 and the organic light emitting diode 300 are disposed on the substrate 100. The substrate 100 encapsulates the organic light emitting diode 300 with the thin film encapsulation layer 400 interposing the wiring portion 200 and the organic light emitting diode 300 therebetween. The substrate 100 and the thin film encapsulation layer 400 protect the wiring portion 200 and the organic light emitting diode 300 from external interference. The substrate 100 may have flexibility, and the thin film encapsulation layer 400 is formed in a thin film such that the OLED display 1001 has flexibility.

The wiring portion 200 includes first and second thin film transistors 10 and 20 (shown in FIG. 2), and drives the organic light emitting diode 300 by transmitting a signal to the organic light emitting diode 300. The organic light emitting diode 300 emits light according to the signal transmitted from the wiring portion 200 to display an image.

The organic light emitting diode 300 is disposed on the wiring portion 200.

The organic light emitting diode 300 is disposed on the substrate 100, and displays an image by emitting light by the signal transmitted from the wiring portion 200.

An internal structure of the OLED display 1001 according to the first exemplary embodiment will now be described in further detail with reference to FIG. 2 and FIG. 3.

Figure 2:
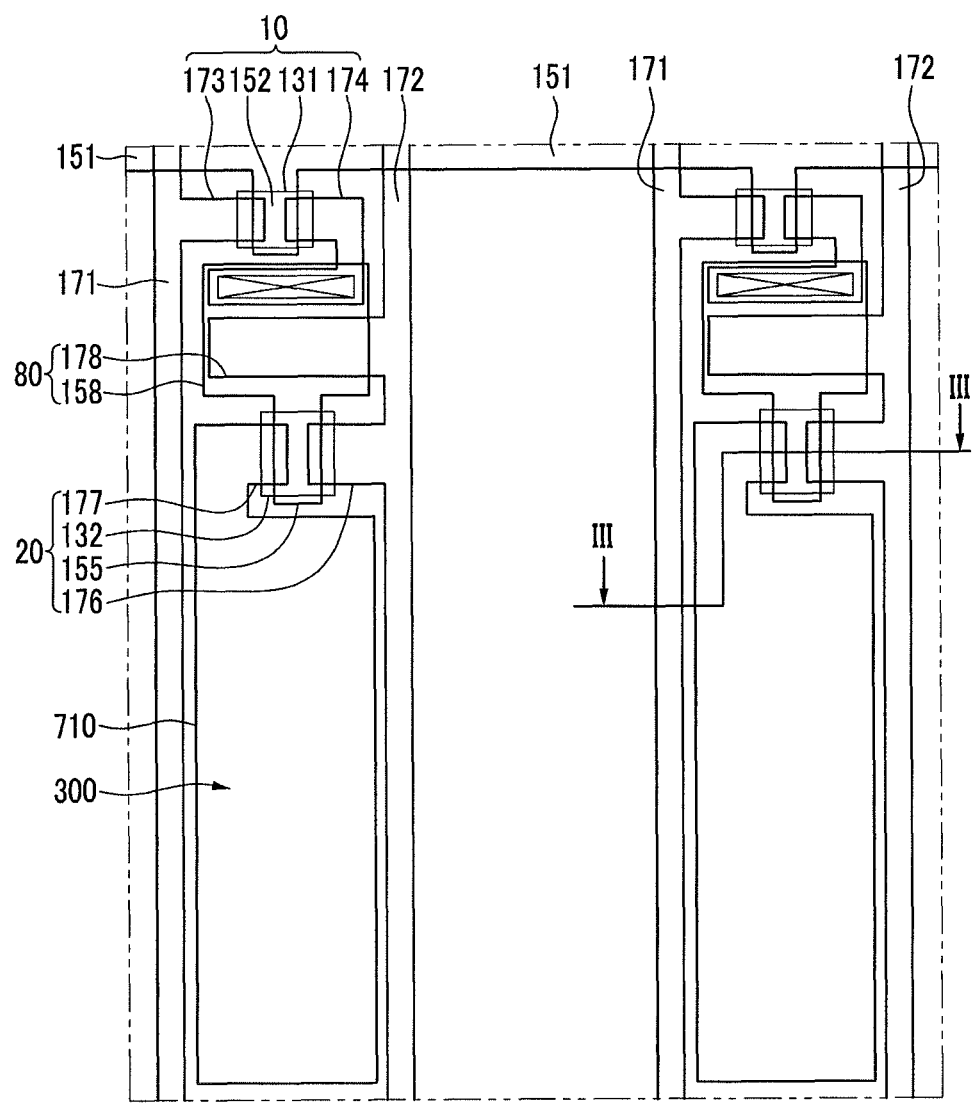
FIG. 2 is a layout view of a pixel structure of the organic light emitting diode display according to the first exemplary embodiment.

FIG. 2 is a layout view of a pixel structure of the OLED display according to the first exemplary embodiment. FIG. 3 is a cross-sectional view of FIG. 2, taken along the line III-III.

Figure 3:
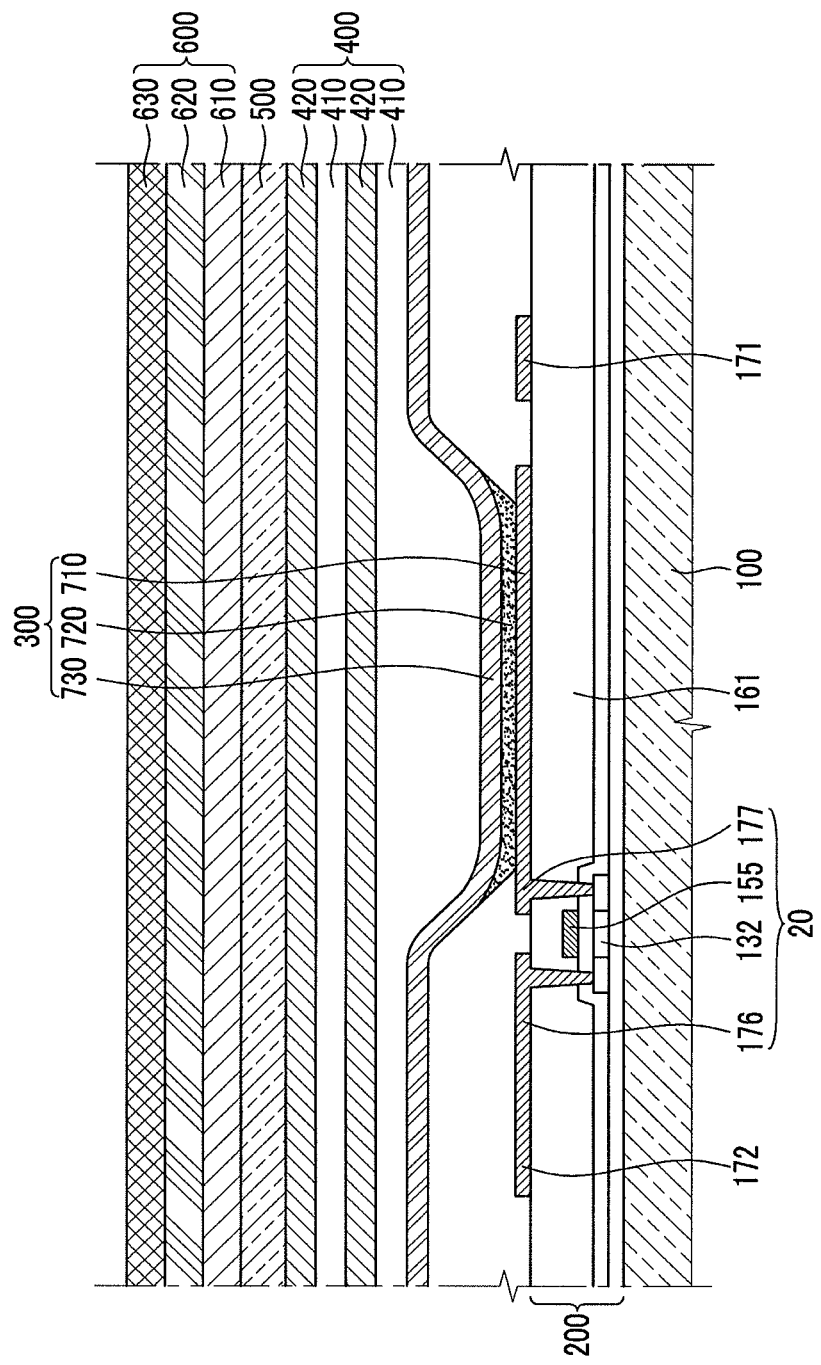
FIG. 3 is a cross-sectional view of FIG. 2, taken along the line III-III.

The entire structure of the wiring portion 200 and the organic light emitting diode 300 are shown in FIG. 2 and FIG. 3, but the present exemplary embodiment is not limited to the structure shown in FIG. 2 and FIG. 3. The structure of the wiring portion 200 and the organic light emitting diode 300 may be variously modified by a person skilled in the art. For example, in the accompanying drawing, an active matrix (AM) organic light emitting diode display having a 2Tr-1Cap structure that includes two thin film transistors (TFTs) 10 and 20 and one capacitor 80 in one pixel is shown as an OLED display, but present embodiments are not limited thereto. Thus, the number of thin film transistors, the number of capacitors, and the number of wires of the OLED display is not restrictive. The pixel represents a minimum unit displaying an image, and the OLED displays an image using a plurality of pixels.

As shown in FIG. 2 and FIG. 3, the OLED display 1001 includes a switching thin film transistor 10, a driving thin film transistor 20, a capacitor 80, and an organic light emitting diode 300 formed in each pixel. Here, a configuration including the switching thin film transistor 10, the driving thin film transistor 20, and the capacitor 80 forms the wiring portion 200. In addition, the wiring portion 200 further includes gate lines 151 arranged along one direction of the substrate 100, data lines 171, and common power lines 172. The data lines 171 and the common power lines 172 cross the gate lines 151 in an insulated manner. Here, one pixel may be defined by the boundary of the gate line 151, the data line 171, and the common power line 172, but present embodiments are not limited thereto.

The organic light emitting diode 300 includes a first electrode 710, an organic emission layer 720 formed on the first electrode 710, and a second electrode 730 formed on the organic emission layer 720. The first electrode 710, organic emission layer 720, and the second electrode 730 form the organic light emitting diode 300. Here, the first electrode 710 becomes an anode, i.e., a hole injection electrode and the second electrode 730 becomes a cathode, i.e., an electron injection electrode. However, the exemplary embodiment is not limited thereto, and the first electrode 710 may become a cathode and the second electrode 730 may become an anode according to a driving method of the OLED display. Holes and electrodes are injected into the organic emission layer 720 respectively from the anode 710 and the cathode 730. When an exciton, in which the hole and the electron injected into the organic emission layer 720 are coupled to each other, falls from an excited state to a ground state, light emission occurs. In addition, at least one of the first and second electrodes 710 and 730, for example the second electrode 730, may be formed in a light transmissive structure, and accordingly, the organic light emitting diode 300 emits light in a direction of the thin film encapsulation layer 400 to display an image.

The capacitor 80 includes a pair of capacitor plates 158 and 178 arranged interposing an interlayer insulating layer 161 therebetween. Here, the interlayer insulating layer 161 becomes a dielectric material, and capacitance of the capacitor 80 is determined by charges charged in the capacitor 80 and a voltage between the two capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch to select a pixel for light emission. The switching gate electrode 152 is connected to the gate line 151. The switching source electrode 173 is connected to the data line 171. The switching drain electrode 174 is distanced from the switching source electrode 173 and is connected with the capacitor plate 158 of the two capacitor plates 158 and 178.

The driving thin film transistor 20 applies driving power to the second electrode 730 for light emission of an organic emission layer 720 of an organic light emitting diode 300 of the selected pixel. The driving gate electrode 155 is connected with the capacitor plate 158 that is connected with the switching drain electrode 174. The driving source electrode 176 and the other capacitor plate 178 are respectively connected with the common power line 172. The driving drain electrode 177 is disposed at the same layer where the first electrode 710 is disposed, and is connected with the first electrode 710.

In the OLED display according to the first exemplary embodiment, the driving drain electrode 177 and the first electrode 710 are disposed on the same layer, but a driving drain electrode of an OLED display according to another exemplary embodiment and a first electrode are disposed in different layers and may access the first electrode through an opening formed in an insulating layer.

With such a structure, the switching thin film transistor 10 is driven by a gate voltage applied to the gate line 151 to transmit a data voltage applied to the data line 171 to the driving thin film transistor 20. A voltage corresponding to a difference between a common voltage applied to the driving thin film transistor 20 from the common power line 172 and the data voltage transmitted from the switching thin film transistor 10 is stored in the capacitor 80, and a current corresponding to the voltage stored in the capacitor 80 flows to the organic light emitting diode 30 through the driving thin film transistor 20 such that the organic light emitting diode 300 emits light.

Referring to FIG. 1 and FIG. 3, the thin film encapsulation layer 400 encapsulates the organic light emitting diode 30 with the substrate 100, and includes a plurality of organic layers 410 and a plurality of inorganic layers 420 alternately arranged with each other.

The organic layer 410 is arranged opposite to the substrate 10, interposing the organic light emitting diode 300 therebetween, and seals the organic light emitting diode 300 by covering the same. The organic layer 410 has a weaker waterproofing property than the inorganic layer 420 but has flexibility so that the organic layer 410 reinforces weakness of the inorganic layer 420 having stronger rigidity than the organic layer 410, and may have a single-layered structure or a multi-layered structure including a resin such as polyethylene terephthalate (PET), polyimide (PI), and polycarbonate (PC).

In the OLED display 1001 according to the first exemplary embodiment, the organic layer 410 includes a resin including at least one of polyethylene terephthalate (PET), polyimide (PI), and polycarbonate (PC), but a resin layer of an OLED display according to another exemplary embodiment may be a single or multiple layer including an engineering plastic including at least one of glass fiber reinforced plastic (FRP), polyethylene terephthalate (PET), and polymethylmethacrylate (PMMA).

The inorganic layer 420 is disposed at the uppermost layer between neighboring organic layers 410 among the plurality of organic layers 410 and the thin film encapsulation layer 400 on the organic light emitting diode 300, and contacts the contamination preventing layer 500. The inorganic layer 420 seals the organic light emitting diode 300 and the organic layer 410 by covering the organic light emitting diode 300 and the organic layer 410. The inorganic layer 420 has an excellent waterproofing property compared to the organic layer 410. The inorganic layer 420 may be a single or multiple layer including at least one of silicon oxide (SiOx), silicon nitride (SiNx), titanium oxide (TiOx), an aluminum oxide such as alumina ($Al_2O_3$), and silicon oxide nitride.

In the OLED display 1001 according to the first exemplary embodiment, the thin film encapsulation layer 400 includes a plurality of organic layers 410 and a plurality of inorganic layers 420 that are alternately arranged with each other, but a thin film encapsulation layer of an OLED display according to another exemplary embodiment may include one organic layer 410 and one inorganic layer 420 sequentially layered on the organic light emitting diode or may include only an inorganic layer 420.

The contamination preventing layer 500 is disposed on the thin film encapsulation layer 400.

The contamination preventing layer 500 is disposed between the thin film encapsulation layer 400 and the optical film 600, and respectively contacts the thin film encapsulation layer 400 and an adhesive layer 610 of the optical film 600. The contamination preventing layer 500 is coated on the thin film encapsulation layer 400. As described, being coated on the thin film encapsulation layer 400, the contamination preventing layer 500 can prevent the thin film encapsulation layer 400 from being contaminated during a manufacturing process of the OLED display 1001 and simultaneously prevents the surface of the thin film encapsulation layer 400 from being damaged due to adherence of the adhesive layer 610 of the optical film 600 when a process is performed to detect the optical film 600 from the thin film encapsulation layer 400 to solve an adherence problem that may occur between the thin film encapsulation layer 400 and the optical film 400 during the manufacturing process of the OLED display 1001.

Particularly, the inorganic layer 420 having the excellent waterproofing property compared to the organic layer 410 is disposed at the uppermost layer of the thin film encapsulation layer 400 for waterproofing of the organic light emitting diode 300. The inorganic layer 420 is made of a fragile material, e.g., a ceramic. Therefore, the inorganic layer 420 may be damaged due to adherence of the adhesive layer 610 of the optical film 600 when a process for detaching the optical film 600 from the thin film encapsulation layer 400 is performed. That is, the contamination preventing layer 500 is disposed between the thin film encapsulation layer 400 and the adhesive layer 610 of the optical film 600 in consideration of the fragility of the inorganic layer 420 disposed at the uppermost layer of the thin film encapsulation layer 400. Accordingly, the contamination preventing layer 500 can prevent damage to the inorganic layer 420 exposed to the surface of the thin film encapsulation layer 400 due to the adherence of the adhesive layer 610 of the optical film 600 during a process for detaching the optical film 600 from the thin film encapsulation layer 400.

Further, the surface of the contamination preventing layer 500 contacting the adhesive layer 610 of the optical film 600 is more hydrophobic than the inorganic layer 420 of the thin film encapsulation layer 400. More particularly, the surface of the contamination preventing layer 500 has a contact angle of about 100 to 200 degrees with respect to water. The contamination preventing layer 500 may include fluorine (F). For example, the contamination preventing layer 500 may include silica and perfluorinated acid (PFA), may include a siloxane group and a perfluoro group, or may include a fluorine-containing graft copolymer.

The optical film 600 is attached to the contamination preventing layer 500.

The optical film 600 is disposed on the thin film encapsulation layer 400, interposing the contamination preventing layer 500 therebetween, and includes an adhesive layer 610 attached to the contamination preventing layer 500 while being in contact with the contamination preventing layer 500. The optical film 600 suppresses reflection of external light irradiated to the OLED display 1001 to improve quality of an image displayed from the organic light emitting diode 300. The optical film 600 further includes a phase difference film 620 and a polarization film 630 sequentially attached on the adhesive layer 610 contacting the contamination preventing layer 500. Here, the phase difference film 620 can change the phase of light of 214, and the polarization film 630 can linearly polarize light.

As described, in the OLED display 1001 according to the first exemplary embodiment, the contamination preventing layer 500 contacting the optical film 600 has a hydrophobic surface. Accordingly, contamination of the thin film encapsulation layer 500 that may occur due to a liquid such as a washing solution that may be used during the manufacturing process of the OLED display 1001 can be prevented. Simultaneously, damage to the surface of the thin film encapsulation layer 400 that may occur due to adherence of the adhesive layer 610 of the optical film 600 when a process is performed to detach the optical film 600 from the thin film encapsulation layer 400 to solve an adherence problem that may occur between the thin film encapsulation layer 400 and the optical film 400 during the manufacturing process of the OLED display 1001 can be prevented because the adhesive layer 610 of the optical film 600 can be easily separated from the contamination preventing layer 500. This can improve the product yield of the OLED display 1001.

Hereinafter, an OLED display 1002 according to a second exemplary embodiment will be described with reference to FIG. 4.

Only characteristic parts of the OLED according to the second embodiment other than those of the OLED display according to the first embodiment are described, and undescribed parts will be appreciated referring to the OLED display according to the first embodiment. In addition, in the second exemplary embodiment, the same reference numerals refer to the same components as those of the OLED display according to the first embodiment, for better comprehension and ease of description.

Figure 4:
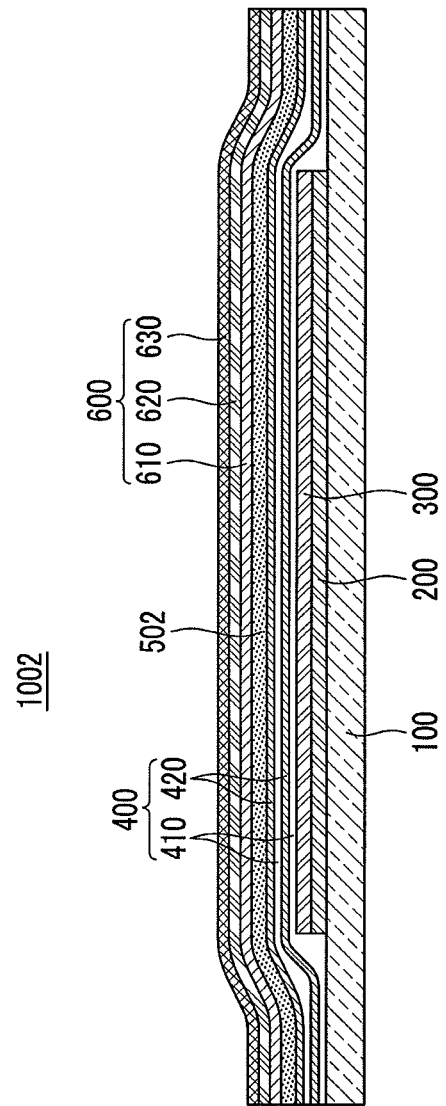
FIG. 4 shows an organic light emitting diode display according to a second exemplary embodiment.

FIG. 4 shows an OLED display 1002 according to the second exemplary embodiment.

As shown in FIG. 4, the OLED display 1002 according to the second exemplary embodiment includes the substrate 100, the wiring portion 200, the organic light emitting diode 300, the thin film encapsulation layer 400, the contamination preventing layer 502, and the optical film 600.

The contamination preventing layer 502 is disposed between the thin film encapsulation layer 400 and the optical film 600, and contacts the thin film encapsulation layer 400 and the adhesive layer 610 of the optical film 600. The contamination preventing layer 502 may be made of, for example, an acryl-based adhesive. The contamination preventing layer 502 is coated on the thin film encapsulation layer 400. As described, by being coated on the thin film encapsulation layer 400, the contamination preventing layer 502 can prevent the thin film encapsulation layer 400 from being contaminated during a manufacturing process of the OLED display 1002, and may simultaneously prevent the surface of the thin film encapsulation layer 400 from being damaged due to adherence of the adhesive layer 610 of the optical film 600 when a process is performed to detach the optical film 600 from the thin film encapsulation layer 400 to solve an adherence problem that may occur between the thin film encapsulation layer 400 and the optical film 400 during the manufacturing process of the OLED display 1002. Particularly, since the contamination preventing layer 502 has weaker adherence compared to the adhesive layer 610 of the optical film 610, the adhesive layer 610 of the optical film 600 is easily detached from the contamination preventing layer 502 when a process for detaching the optical film 600 from the thin film encapsulation layer 400 to solve an adherence failure between the thin film encapsulation layer 400 and the optical film 600 that may occur during a manufacturing process of the OLED display 1002 such than the optical film 600 is easily separated from the thin film encapsulation layer 400, thereby preventing damage to the surface of the thin film encapsulation layer 400 due to adherence of the adhesive layer 610 of the optical film 600. This can improve the product yield of the OLED display 1002.

By way of summation and review, an organic light emitting diode display has been developed using a thin film encapsulation layer as an encapsulation member.

However, the organic light emitting diode display attaches an optical film, i.e., a polarization plate to the thin film encapsulation layer to improve quality of an image displayed by the organic light emitting diode. When a process for detaching the optical film from the thin film encapsulation layer is performed to solve an adherence failure of the optical film with respect to the organic light emitting diode display, damage may occur to the surface of the thin film encapsulation layer. The damage may occur because of adherence of the optical film when the optical film is detached from the thin film encapsulation layer.

Embodiments are directed to an organic light emitting diode (OLED) display including a thin film encapsulation layer that encapsulates an organic light emitting diode. The OLED display may suppress damage to the surface of a thin film encapsulation layer during re-processing of an optical film attached to the thin film encapsulation layer.

Exemplary embodiments have been disclosed herein, and although specific terms are employed, they are used and are to be interpreted in a generic and descriptive sense only and not for purpose of limitation.

What is claimed is:

1. An organic light emitting diode (OLED) display, comprising:
   a substrate;
   an organic light emitting diode on the substrate;
   a thin film encapsulation layer encapsulating the organic light emitting diode with the substrate, and including a plurality of organic layers and a plurality of inorganic layers alternately arranged with each other;
   an optical film on the thin film encapsulation layer and including an adhesive layer opposite to the thin film encapsulation layer; and
   a contamination preventing layer between the thin film encapsulation layer and the adhesive layer,
   wherein the contamination preventing layer directly contacts the thin film encapsulation layer and the adhesive layer, and the contamination preventing layer has a weaker adherence to the adhesive layer relative to an adherence between the thin film encapsulation layer and the adhesive layer, and
   wherein one of the plurality of the inorganic layers directly contacts the contamination preventing layer.

2. The OLED display as claimed in claim 1, wherein a surface of the contamination preventing layer contacting the adhesive layer is more hydrophobic than the thin film encapsulation layer.

3. The OLED display as claimed in claim 2, wherein the surface of the contamination preventing layer has a contact angle of about 100 to 200 degrees with respect to water.

4. The OLED display as claimed in claim 2, wherein the contamination preventing layer includes fluorine (F).

5. The OLED display as claimed in claim 1, wherein the optical film includes a polarization film.

6. The OLED display as claimed in claim 1, wherein the contamination preventing layer is hydrophobic such that the adhesive layer may be easily separated from the contamination preventing layer without damaging the thin film encapsulation layer.

7. The OLED display as claimed in claim 1, wherein the contamination preventing layer includes siloxane.

* * * * *